(12) United States Patent
Takahasi et al.

(10) Patent No.: US 6,370,007 B2
(45) Date of Patent: *Apr. 9, 2002

(54) ELECTROSTATIC CHUCK

(75) Inventors: Kazue Takahasi; Youichi Itou, both of Kudamatsu; Saburo Kanai, Hikari; Seiichiro Kanno, Inayoshi, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/795,486

(22) Filed: Mar. 1, 2001

Related U.S. Application Data

(63) Continuation of application No. 09/110,207, filed on Jul. 6, 1998, which is a continuation of application No. 08/710,514, filed on Sep. 18, 1996, now Pat. No. 5,781,400.

(30) Foreign Application Priority Data

Sep. 20, 1995 (JP) ............................................. 7-241261
Sep. 20, 1995 (JP) ............................................. 7-241268

(51) Int. Cl.⁷ ............................................. H02N 13/00
(52) U.S. Cl. ....................................................... 361/234
(58) Field of Search ................................ 361/230–235; 279/128

(56) References Cited

U.S. PATENT DOCUMENTS

| | | |
|---|---|---|
| 4,480,284 A | 10/1984 | Tojo et al. |
| 4,520,421 A | 5/1985 | Sakitani et al. |
| 5,055,964 A | 10/1991 | Logan et al. |
| 5,099,571 A | 3/1992 | Logan et al. |
| 5,191,506 A | 3/1993 | Logan et al. |
| 5,345,999 A | 9/1994 | Hosokawa |
| 5,572,398 A | 11/1996 | Federlin |
| 5,625,526 A | 4/1997 | Watanabe |
| 5,745,332 A * | 4/1998 | Burkhart et al. ............. 361/234 |
| 5,764,471 A * | 6/1998 | Burkhart ..................... 361/234 |
| 5,781,400 A * | 7/1998 | Takahashi et al. .......... 361/234 |
| 5,886,863 A | 3/1999 | Nagasaki et al. |
| 5,909,354 A | 6/1999 | Harada et al. |

\* cited by examiner

Primary Examiner—Fritz Fleming
(74) Attorney, Agent, or Firm—Antonelli, Terry, Stout & Kraus, LLP

(57) ABSTRACT

An electrostatic chuck for holding a substrate, including an electrode block which serves as an electrode for electrostatic attraction and a plurality of electrostatic attraction arranged on a surface of the electrode block. The electrostatic attraction members are disposed so as to attract the substrate electrostatically and to come in contact with the substrate. An insulating material covers the surface of the electrode block other than attraction surfaces of the electrostatic attraction members. Grooves made by the insulating material are provided between the individual electrostatic attraction members.

3 Claims, 11 Drawing Sheets

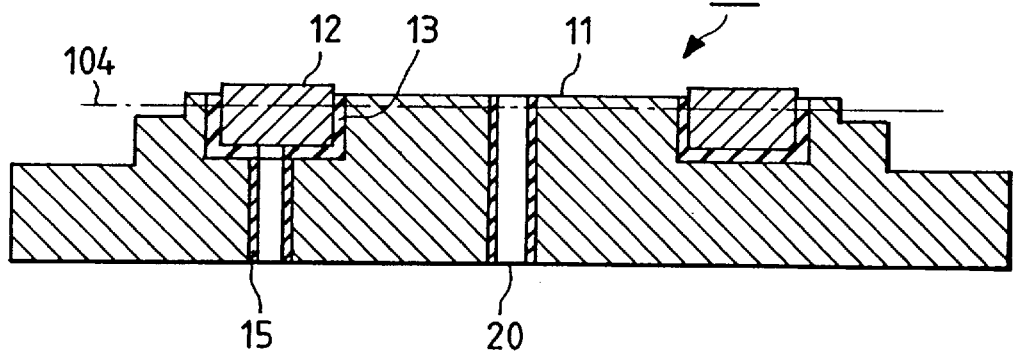
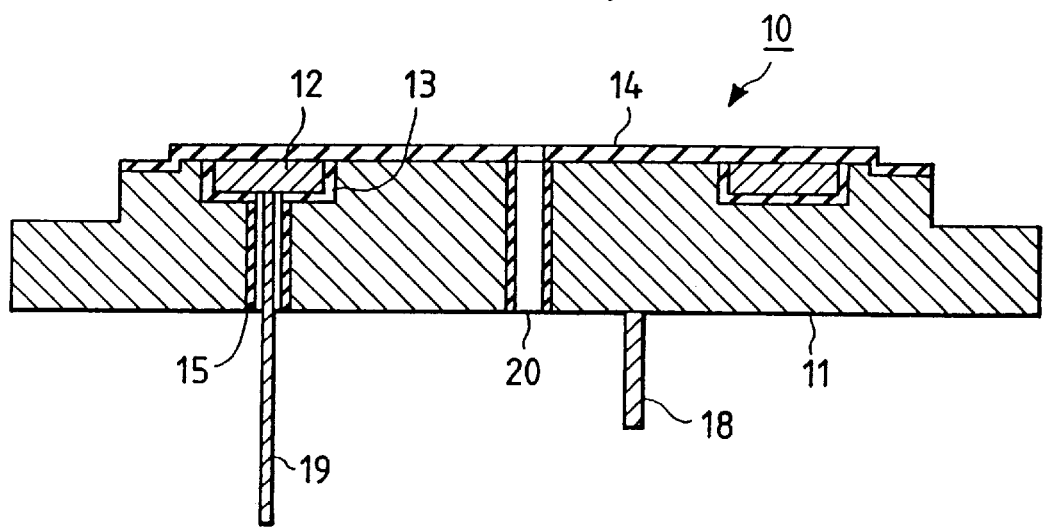

ELECTROSTATIC CHUCK

CROSS REFERENCE TO RELATED APPLICATION

This is a continuation of U.S. application Ser. No. 09/110,207, filed Jul. 6, 1998, which is a continuation U.S. application Ser. No. 08/710,514, filed Sep. 18, 1996, now U.S. Pat. No. 5,781,400, issued Jul. 14, 1998, the subject matter of which is incorporated by reference herein.

BACKGROUND OF THE INVENTION

1. Field of the Invention

The present invention relates to an electrostatically attracting electrode and a method of manufacture thereof. More particularly, this invention relates to an electrostatically attracting electrode suited for holding a substrate on a sample table by using an electrostatic force when a semiconductor substrate such as a wafer is subjected to plasma process or heat treatment, and a method of manufacturing such an electrode.

2. Description of the Prior Art

Conventional electrostatically attracting electrodes used in substrate processing equipment have been primarily of a so-called monopole electrode type, in which a high negative voltage is applied to the electrode that attracts the substrate and a circuit that is grounded from the substrate to the ground through a plasma is provided. One example is an electrostatic chuck disclosed in Japanese Patent Laid-Open No. 216224/1994. The monopole electrode has features such as a simplified electrostatic attraction circuit and a constant, applied electrostatic potential at the substrate. The disadvantage of the monopole electrode is that the electrostatic charge cannot be removed unless a plasma is generated.

In the electrostatic chuck described in Japanese Patent Laid-Open No. 216224/1994, a ceramic that forms an electrostatic attraction member is brazed at low temperatures to an electrode block. The electrostatic attraction ceramic must be finished to a predetermined small thickness because too thick an attraction ceramic cannot produce an attraction force. The electrostatic chuck is formed by sticking the thick ceramic plate to the electrode block and polishing it to a predetermined thickness.

Another example of the electrostatically attracting electrode using the monopole electrode is an electrostatic chuck described in Japanese Patent Laid-Open No. 275708/1994. This electrostatic chuck is fabricated by bonding, through an insulating film, an electrostatic attraction film to the surface of a susceptor (block) mace of a metal such as aluminum. By this method the electrostatic attraction film is formed by using such materials as SiC having a particular range of resistivity and forms a portion corresponding to the wafer attraction surface in one piece.

Another example similar to the above is an electrostatic chuck used in a plasma process equipment described in Japanese Patent Laid-Open No. 260449/1994.

The electrode of a so-called dipole type has a positive and a negative electrode arranged in the plane of a substrate surface to be held by attraction and has an advantage that the electrostatic attraction charge can be eliminated regardless of the presence or absence of a plasma. Examples of the electrostatically attracting electrode using the dipole electrode include a wafer chuck described in U.S. Pat. No. 5,055,964. This electrostatic chuck described in this reference is a type of chuck which has a second electrode within a first electrode. The first electrode can be made from a single, conducting block. Similarly, the second electrode is made from a single, conducting block. After joining the first electrode and the second electrode, the top surface of assembled chuck is machined. The top surface of the assembled chuck is machined to final dimension, smoothness, and flatness. Finally, a layer of insulator is applied to the top clamping surface of chuck. Such application may be any suitable method, including anodization.

SUMMARY OF THE INVENTION

As the wafer increases in size (from 6 inch to 8 inch, further from 8 inch to 12 inch), the difference in thermal expansion between the electrostatic attraction film and the electrode block a problem may occur depending on the electrode temperature, and hence the manufacture of large electrostatic attraction films becomes difficult. For example, there is a problem that it is difficult to handle a ceramic board described in Japanese Patent Laid-Open No. 216224/1994 during a bonding step unless the ceramic board is thick enough to some extent, in other words, the board has a sufficient strength.

In the case in which the electrostatic attraction film is formed by flame spraying, there will be less of the above problems. The flame sprayed film, however, has problems that the breakdown voltage is low compared with that of the sintered material and that the physical property values required for electrostatic attraction such as the permittivity and the electric resistance are more difficult to control than their corresponding values of the sintered material.

Furthermore, because the electrostatic attraction film must not change in thickness and must be kept thin even when the wafer becomes large, its handling is very difficult. When the wafer is further increased in size, it will become even more difficult to make the electrostatic attraction film using a sintered material. That is, the sintered member as an electrostatic attracting layer has a smaller thickness compared with the size of the sintered member. It is difficult to handle the thin sintered member since it is easily cracked because of a small thermal strain.

It is a primary object of the present invention to provide an electrostatically attracting electrode and a method of manufacture thereof that can solve the above problems and can handle a large-size wafer. This object can be achieved by separating the electrode into a first electrode and a second electrode, providing a recess in a part of the first electrode, forming an insulating film in the recess, inserting and fixing a second electrode in the recess, planarizing the surfaces of the both electrodes, forming an electrostatic attraction insulating film over the electrodes, and then polishing the film to a predetermined thickness.

A second object of this invention is to provide an electrostatically attracting electrode and a method of manufacture of the electrostatically attracting electrode, which can be manufactured to a desired size with good precision to handle a large-size wafer and whose insulating film over the electrodes can be controlled easily. This object can be achieved by dividing an electrostatically attracting sintered material of the electrostatic attraction member, into a plurality of pieces and arranging them on the electrode block, bonding or mechanically fixing the electrostatic attraction member on the electrode block, flame-spraying an insulating film over the electrode block to which the electrostatic attraction member is fixedly attached, and polishing the surface of the electrode block covered with the insulating film to expose the surface of the electrostatic attraction member.

BRIEF DESCRIPTION OF THE DRAWINGS

FIG. 8 is a vertical cross section showing the process of fabricating the electrostatically attracting electrode of FIG. 1, with the electrodes 1, 2 in an assembled state;

FIG. 9 is a vertical cross section showing the process of fabricating the electrostatically attracting electrode of FIG. 1, with the electrostatically attracting electrode in a finished state;

DESCRIPTION OF THE PREFERRED EMBODIMENT

A first electrode is formed at a part with a recess, where an insulating film is deposited. A second electrode is inserted and fixed in the recess. Now, the surfaces of the first and second electrodes can be machined. This process permits the electrode surfaces to be formed flat, facilitating the manufacture of electrodes. Because this process allows high precision fabrication, the thickness of the electrostatic attraction insulating film sprayed over the flattened electrode surface also can be finished with a high precision, enabling easy control of the electrostatic attraction characteristics. As a result, the difficulty in manufacturing a one-piece electrostatic attraction film, attributed to the increase of the size of wafers is eliminated.

The use of a sintered material, whose physical properties are relatively stable, for the electrostatic attraction member solves the problem of low breakdown voltage. The electrostatic attraction member is composed of a plurality of small sintered plate members. These are arranged on the electrode block to form an electrostatic attraction surface and then they are bonded by, e.g., brazing. Next, an insulating material such as alumina having a high breakdown voltage is sprayed over the electrode block to which the sintered members are securely attached. Then, the electrode block is polished until the sintered members are exposed to a predetermined thickness. This process of fabricating the electrostatically attracting electrode allows the electrostatic attraction surface to be formed of a sintered material and other parts to be formed of a sprayed film having a high breakdown voltage. As a result, it is possible to determine the electrostatic attraction characteristics by the physical property values of the sintered material and form the electrostatic attraction surface with a combination of small sintered members. This in turn eliminates the difficulty in making the one-piece electrostatic attraction film because of the increase of the size of the wafers.

Now, one embodiment of this invention will be explained referring to FIG. 1 through FIG. 9.

Figure 1:
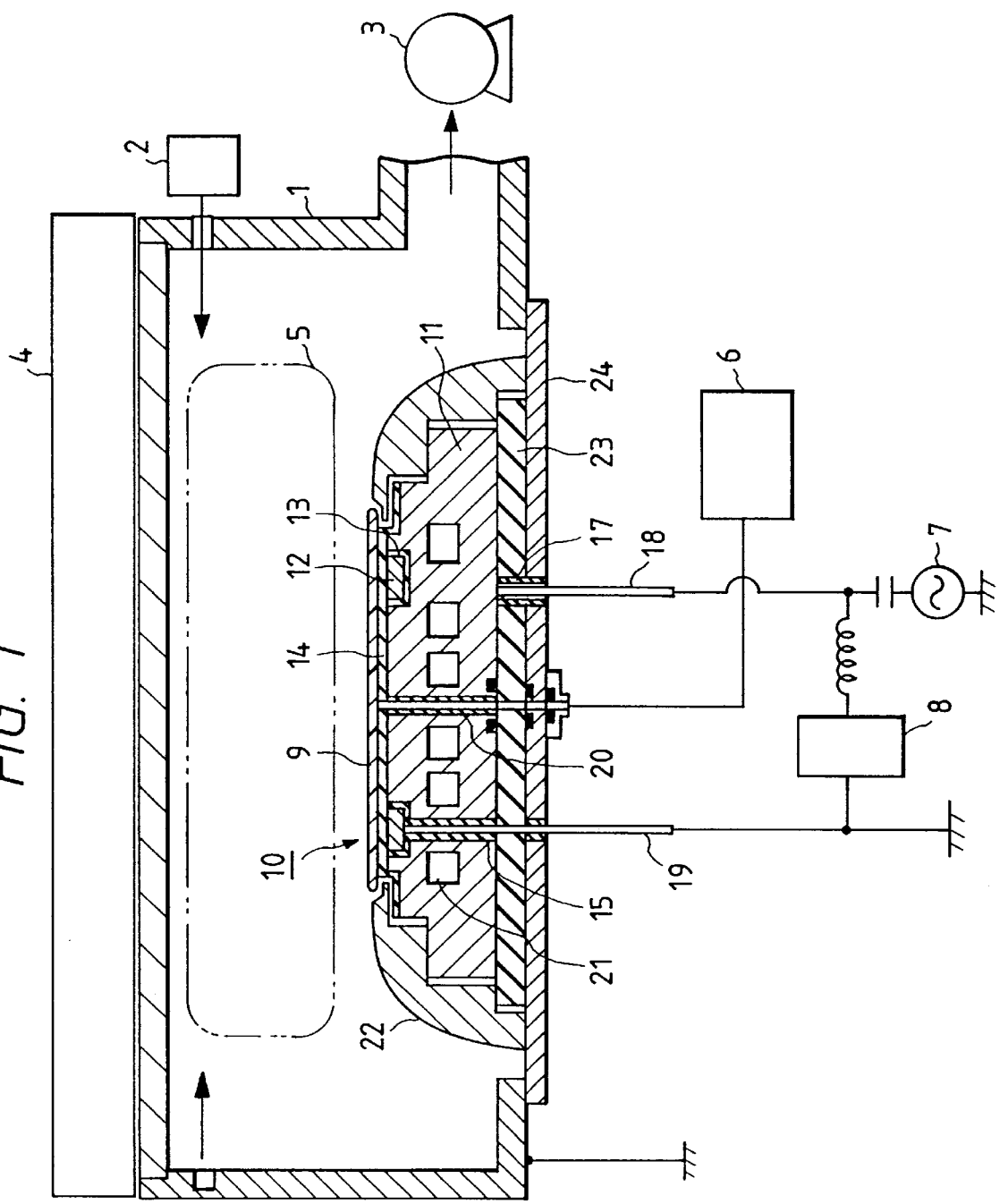
FIG. 1 is a vertical cross section showing the configuration of a substrate processing apparatus using an electrostatically attracting electrode as one embodiment of this invention.

FIG. 1 shows one example of a wafer processing apparatus using the electrostatically attracting electrode of this embodiment. The wafer processing apparatuses may include, for example, etching apparatuses, plasma processing apparatuses using plasma such as a film forming apparatuses, and a vacuum processing apparatus such as ion implanters. A plasma processing apparatus will be explained as an example.

A vacuum container 1 in which a plasma 5 is produced is connected with a gas supply apparatus 2 and an evacuation apparatus 3 and is provided with a plasma generating apparatus 4. In the vacuum container [there is provided a sample table on which is mounted a sample or substrate 9 to be processed by the plasma 5, such as a semiconductor wafer and a liquid crystal substrate. The sample table is made by using an electrostatically attracting electrode 10.

The electrostatically attracting electrode 10 in this ease comprises an electrode 11, an electrode 12, an insulating film 13 and an insulating film 14. The electrode 11 has a coolant passage 21 formed therein and a ring-shaped recess formed in the top surface. The electrode 12 is formed in a ring shape. The electrodes 11 and 12 are made of a conductive material such as aluminum alloy. In the recess in the top of the electrode 11 the electrode 12 is fitted and secured through the insulating film 13. The insulating film 13 interposed between the electrode 11 and the electrode 12 electrically insulates them from one another. The surfaces of the electrode 11 and the electrode 12 are covered with the insulating film 14 for electrostatic attraction.

The electrode 11 is connected with a lead wire 18 for voltage application and the electrode 12 with a lead wire 19 for voltage application. Connection of the lead wire 19 is made through a via hole formed by an insulating sleeve 15 provided in the electrode 11. The lead wire 19 and the electrode 11 are electrically isolated by the insulating sleeve 15. The lead wires 18, 19 are connected to an electrostatic attraction power supply 8. Because the electrode 11 and the electrode 12 are electrically isolated, applying a positive and a negative voltage from the electrostatic attraction power supply 8 to these electrodes causes the substrate 9 to be electrostatically attracted to the top surface of the electrodes 11, 12. Connection of the lead wire 19 to the electrode 12 is easily accomplished by forming a female thread, not shown, in the electrode 12 and a male thread at the leading and of the lead wire 19 and screwing the lead wire 19 into the electrode 12. This also applies to the connection of the electrode 11 and the lead wire 18.

At the center of the electrode 11 is provided a via hole 20 formed by an insulating sleeve, which is used to introduce a heat transmission gas to the back of the electrostatically attracted wafer. The electrostatic attraction insulating film 14 is formed by spraying and, at the final stage of manufacture, is polished to form a flat surface to a predetermined thickness. If the sprayed insulating film 14 is used, grooves can easily be made in the surface of the electrode 11 or 12 by forming recesses (not shown) beforehand in the electrode surface through machining and then spraying the insulating film 14. This facilitates the electrode designing of forming gas dispersion grooves in the electrode surface. The gas dispersion grooves in the electrode surface are provided for supplying a heat transmission gas (e.g., helium gas) to the back of the substrate to control the temperature of the substrate to be processed and for adjusting the heat transmission characteristics to make uniform the substrate temperature distribution.

Mounting the electrostatically attracting electrode 10 to the bottom of the vacuum container 1 is accomplished by a grounding plate 24. The grounding plate 24 is mounted with the electrode 11 through an insulating plate 23. To prevent leakage of the heat transmission gas supplied to the via hole 20 made in the center of the electrode 11, connection parts are sealed and the electrode 11, insulating plate 23 and grounding plate 24 are fastened with bolts (not shown). On the outer periphery of the electrode 11 is provided a cover 22, which is gradually inclined toward the outer periphery. Hence, there is no hidden part when it is irradiated with ions in the plasma from above. This ensures that even when reaction products are deposited on the cover 22 during the plasma etching, they can easily be removed by subjecting them to a cleaning plasma. Consequently foreign particulates can easily be reduced.

Further, the electrode 11 is connected with a bias power source 7 along with the electrostatic attraction power supply 8. The bias power source 7 applies a high-frequency bias voltage to the electrode 11. To prevent an abnormal discharge between the electrode 11 and the grounding plate 24, the diameters of the electrode 11, insulating plate 23 and grounding plate 24 are made different from each other so that the electrode 11 and the grounding plate 24 are not directly viewed at the same time. This arrangement obviates the need for providing a separate insulating member around the periphery of the electrode 11, and the cover 22 has the function of the insulation.

The temperature control of the substrate 9 shown in FIG. 1 is performed by controlling the temperature of the coolant flowing through the coolant passages 21 formed in the electrode 11. That is, the temperature of the coolant controls the temperature of the electrode 11, and the temperature of the substrate 9 is controlled through the electrostatic attraction insulating film 14 and the heat transmission gas. Although the coolant passages 21 are provided only in the electrode 11, the electrode 12, too, is temperature-controlled by heat conduction through the insulating film 13. Hence, there is no need to supply the coolant to the electrode 12. Therefore, the coolant passages 21 need be provided only in the electrode 11, simplifying the construction.

In this embodiment, a substrate transfer mechanism is not shown.

The process of fabricating the electrostatically attracting electrode of the above construction will be explained below.

Figure 2:
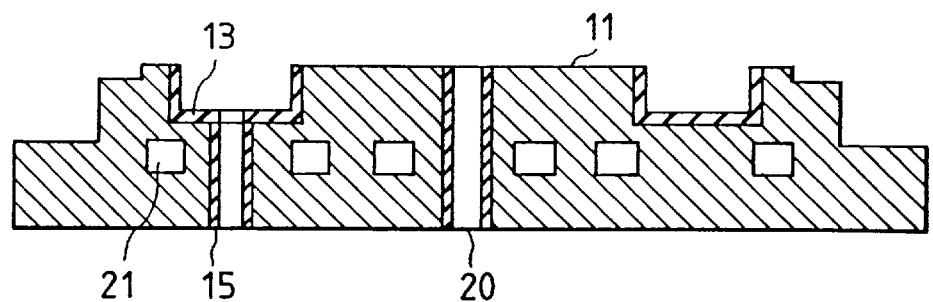
FIG. 2 is a cross section showing the process of manufacturing the electrostatically attracting electrode of FIG. 1, with an insulating film formed over an electrode 1.
Figure 3:
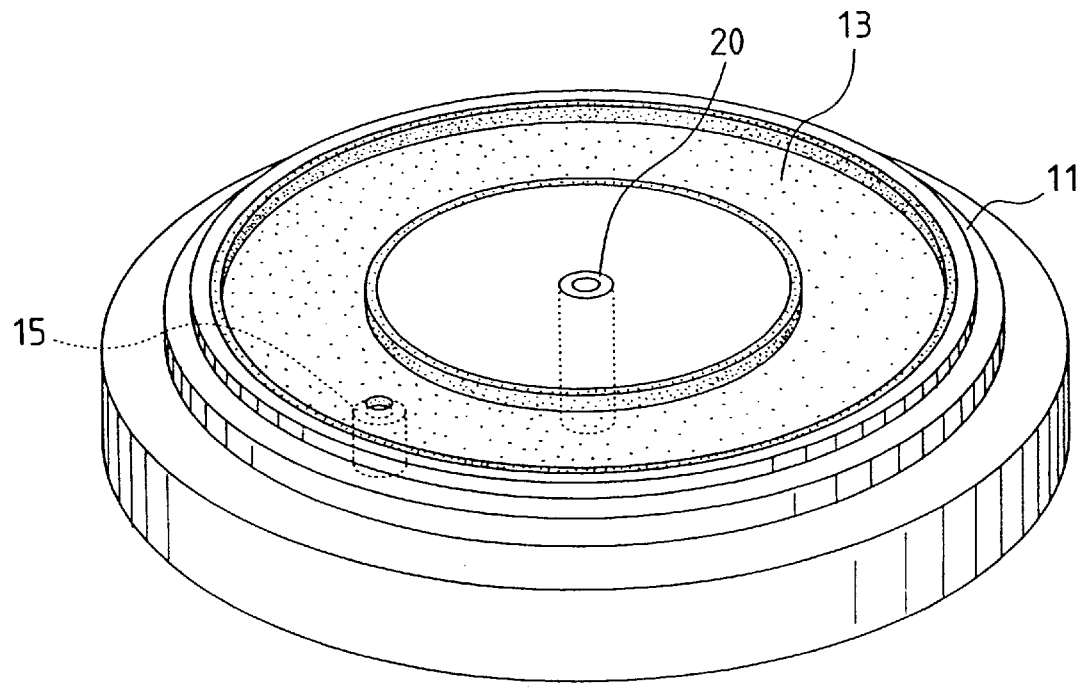
FIG. 3 is a perspective view showing the electrode of FIG. 2.

First, the electrode 11 shown in FIG. 2 is prepared. The electrode 11 is provided beforehand with a recess in which to install the electrode 12. In the recess the insulating film 13 is formed, in this case, by flame spraying as a 100% alumina film with an excellent insulation performance to ensure electrical isolation between the electrode 11 and the electrode 12. FIG. 3 is a three-dimensional view of FIG. 2. In a part of the insulating film 13 a hole that leads to the via hole of the insulating sleeve 15 is made. At the center of the electrode 11 is provided the via hole 20, which is a supply passage for the heat transmission gas.

While the embodiment of FIG. 2 and 3 shows the insulating film 13 formed by flame spraying, the insulating film may also be formed in the following manner.

Figure 4:
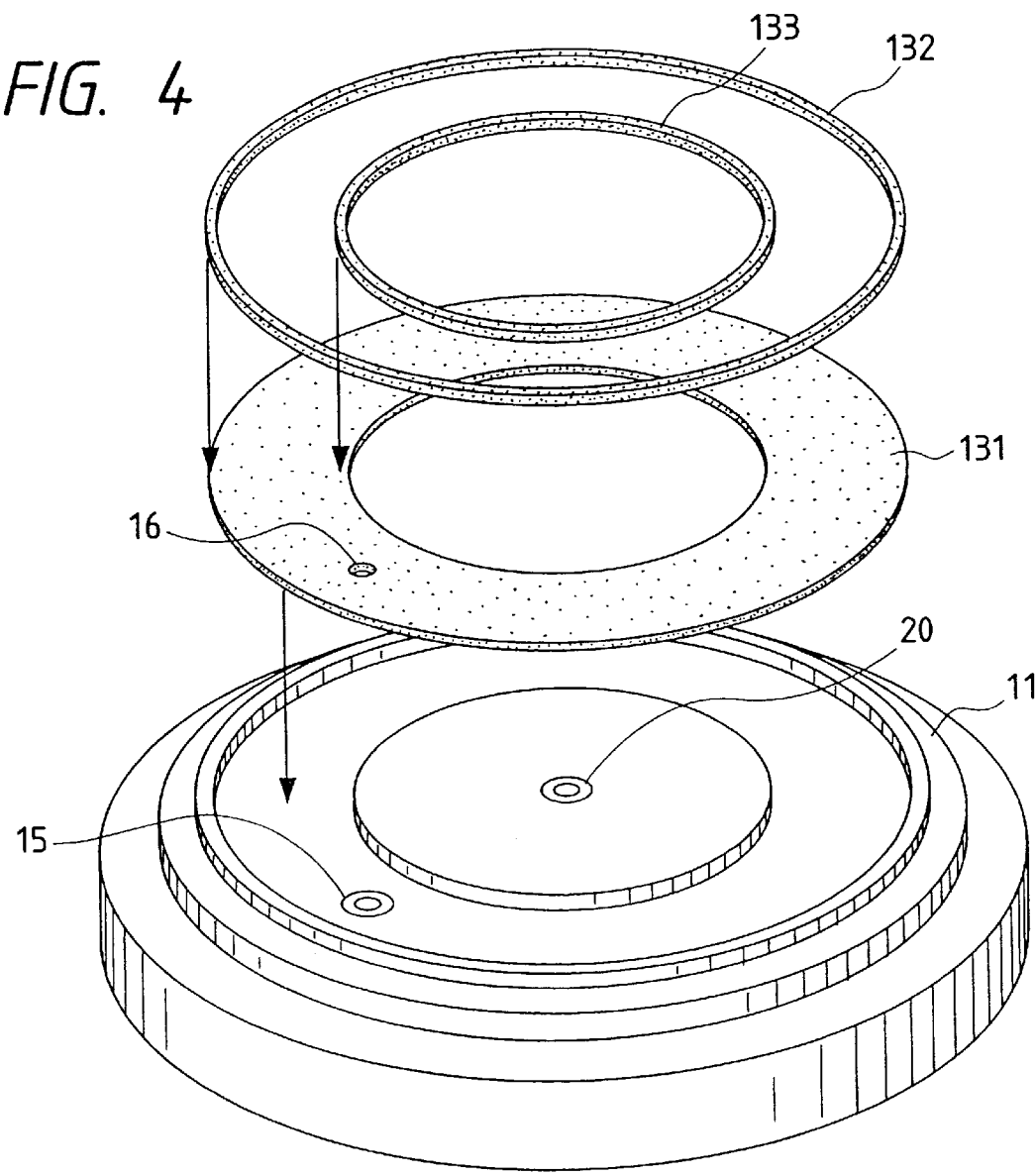
FIG. 4 is a perspective view showing another embodiment of an insulating film formed over the electrode of FIG. 3.

The insulating film interposed between the facing surfaces of the electrode 11 and the electrode 12 is replaced by an insulating material such as alumina. One example is shown in FIG. 4. This insulating film comprises a bottom insulating plate 131, an outer sidewall insulating ring 132 and an inner sidewall insulating ring 133, and provides reliable electrical isolation between the electrode 11 and the electrode 12. The bottom insulating plate 131 has a hole 16 at a position corresponding to the insulating sleeve 15 to pass the lead wire 19 therethrough. The bottom insulating plate 131 and the sidewall insulating rings 132, 133 may be formed as separate parts as shown in FIG. 4 or formed as one integral component.

Figure 5:
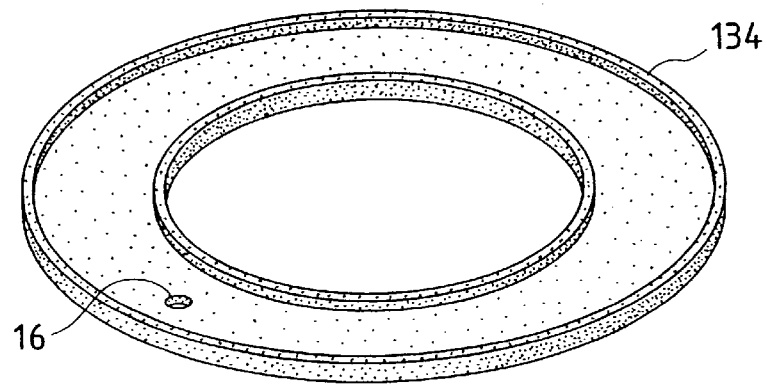
FIG. 5 is a perspective view showing still another embodiment of an insulating film formed over the electrode of FIG. 3.
Figure 6:
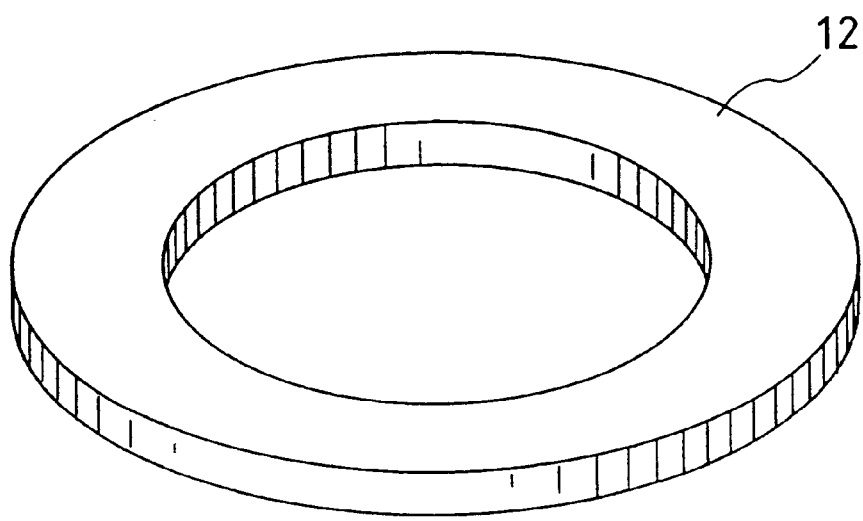
FIG. 6 is a perspective view showing an electrode 2 of the electrostatically attracting electrode of FIG. 1.

The electrode 12 to be fitted in the recess in the electrode 11 of FIG. 2 is shown in FIG. 6. The ring-shaped electrode 12 is used when the insulating film and insulating material shown in FIG. 3, 4 and 5 are employed.

Figure 7:
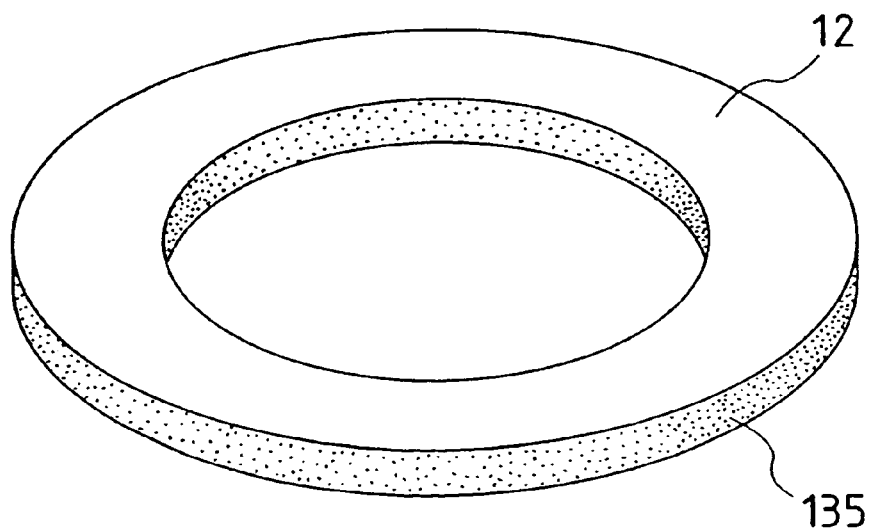
FIG. 7 is a perspective view showing another embodiment of the electrode 2 of FIG. 6.

While FIG. 2 and 3 show the insulating film 13 provided to the electrode 11, the insulating film may be provided to the electrode 12. FIG. 7 shows an example where the insulating film 135 is provided to the electrode 12. The insulating film 135 is provided to the bottom and sidewalls of the electrode 12 by flame spraying.

Next, FIG. 8 shows the electrode 12 fitted in the electrode 11. Except when the insulating film 13 is fabricated to a thickness of the order of microns, the upper surfaces of the electrode 11 and the electrode 12 machined with ordinary precision are not always flush with each other. By polishing the electrodes down to the surface shown by a dash-and-dot line in FIG. 8, the upper surfaces of the electrode 11 and the electrode 12 are planarized in one plane.

Next, as shown in FIG. 9, an electrostatic attraction insulating film is formed over the polished upper surface by flame spraying. At the final step, the electrostatic attraction insulating film is finally polished to a predetermined thickness.

As described above, as the top surfaces of the electrodes are machined, each top surface of electrodes is turned to be flat on a common plane. An insulating layer is sprayed on the flat electrodes, and the insulating layer is machined finally to form a desired thickness. Therefore, this embodiment allows easy manufacture of the electrodes to a desired size with good precision and facilitates the control of the insulating film formed over the electrodes. Hence, it is possible to form large-diameter electrodes easily with high precision, which in turn offers the advantage of stabilizing the electrostatic attraction characteristics. Further, because each component can be made by machining, the manufacturing cost is reduced. In addition, because the lead wire and the electrode can be connected by the bolt fastening method, the embodiment offers reliable connection and excellent assembly performance. Because the electrode surfaces can be machined to desired shapes, it is possible to freely design the gas (helium gas) passage on the back of the substrate for the substrate temperature control. Furthermore, because the substrate attracting surface is polished and the cooling gas can be supplied to the back of the substrate, it is possible to control the temperature of the attraction surface uniformly by the electrodes that are temperature-controlled by coolant, thus facilitating the temperature control of the substrate.

The second embodiment of this invention will be described referring to FIG. 10 to FIG. 15. Along with the second embodiment, another method of forming the electrostatic attraction insulating film will be also explained.

Figure 10:
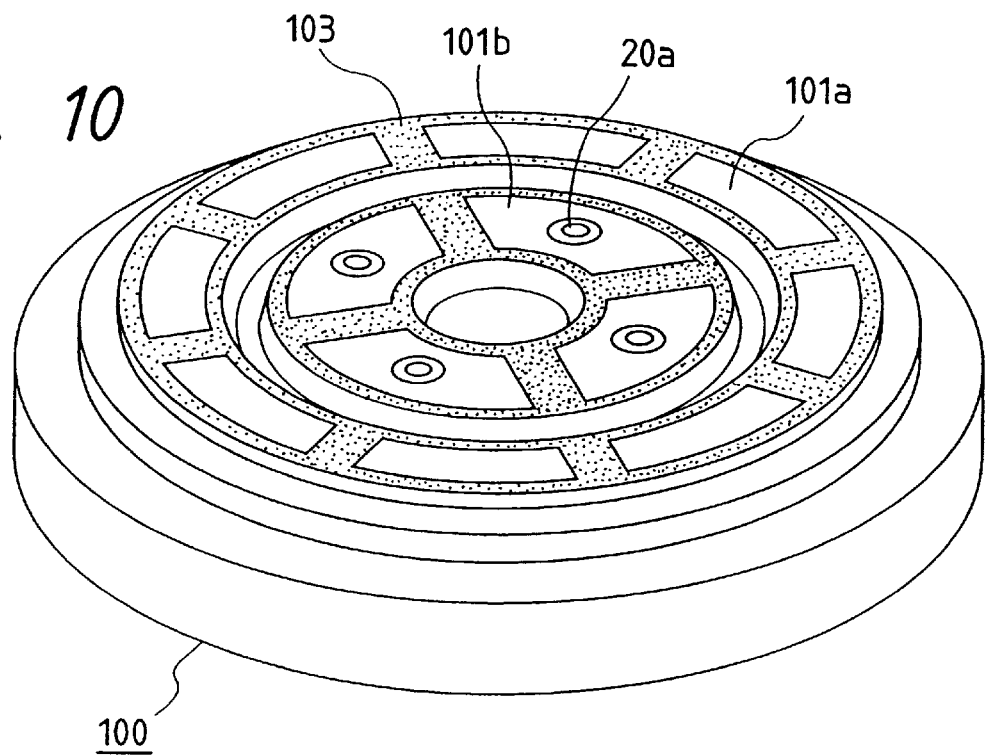
FIG. 10 is a perspective view showing a further embodiment of the electrostatically attracting electrode of FIG. 1.

FIG. 10 shows the electrostatically attracting electrode manufactured by this embodiment. An electrode block 100 comprises electrodes 11 and 12 of the first embodiment. The upper surface of the electrode block 100 is provided with a plurality of electrostatically attracting sintered members 101a,b and a sprayed film 103. The electrostatically attracting sintered members 101a,b in this embodiment are arranged in a double structure, inner members and outer members. The electrostatically attracting sintered members 101b arranged on the inner circle are provided with through-holes 20a for the treat transmission gas. The upper surfaces of the electrostatically attracting sintered members 101a,b and the sprayed film 103 are polished to form a polished surface 104, on which a substrate is held. That is, in the case of the dipole type electrostatically attracting electrode, the electrodes 11, 12 to which positive and negative voltages are-applied are combined through the insulating film 13, the sintered members 101a,b are arranged correspondingly to individual electrodes, and an insulating film is then sprayed over these. In this way, the electrostatically attracting electrode can be manufactured in a process similar to that of the monopole.

Now, a method of fabricating the electrostatically attracting electrode of this embodiment will be described.

Figure 11:
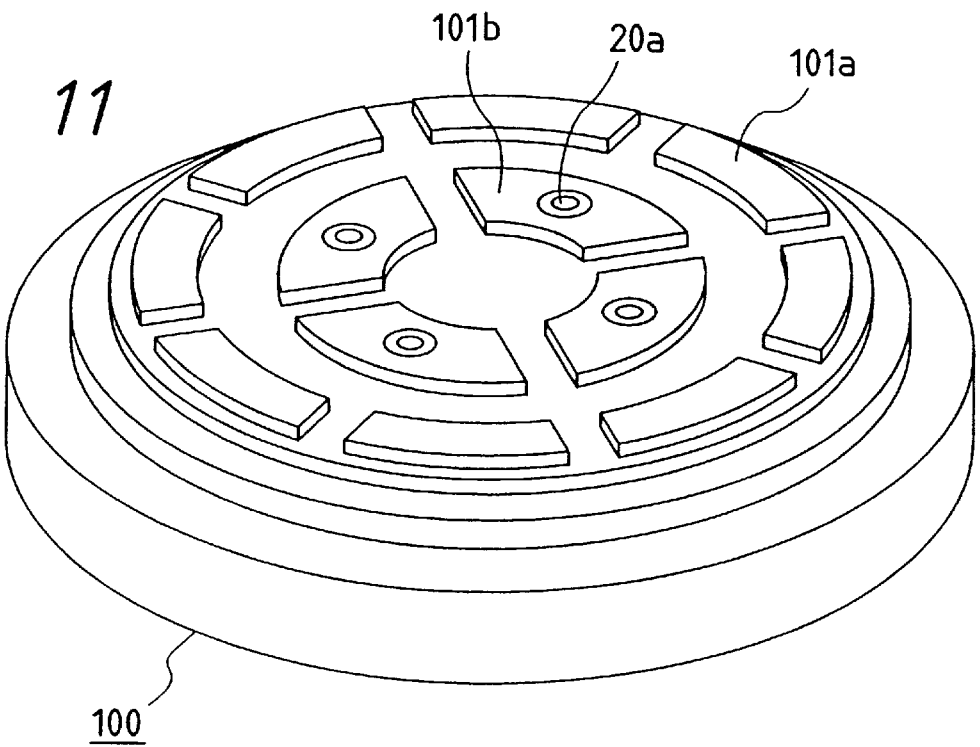
FIG. 11 is a perspective view showing the process of fabricating the electrostatically attracting electrode of FIG. 10, in a state that sintered bodies are arranged on the electrode block.

FIG. 11 shows the first step in the method of manufacturing the electrostatically attracting electrode. On the upper surface of the electrode block 100 made of aluminum or aluminum alloy are arranged electrostatically attracting sintered members 101a,b made of a alumina-titania sintered material or silicon carbide (SIC) which have an electric resistance of about $10^{10}$-$10^{11}$ ohm·cm.

Figure 12:
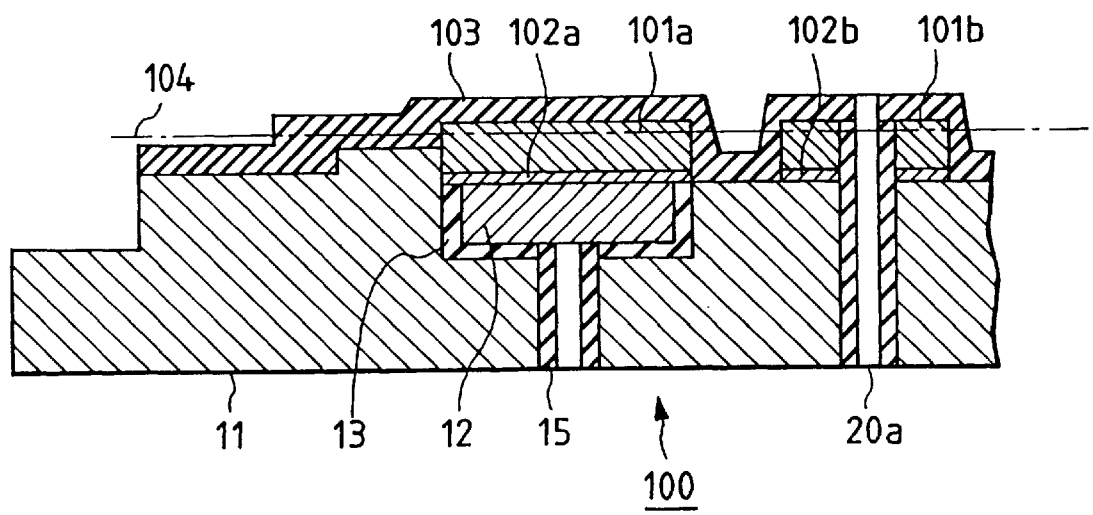
FIG. 12 is a cross section showing the process of fabricating the electrostatically attracting electrode of FIG. 10, in a state that an insulating film is being sprayed onto the electrode block after the sintered bodies are arranged.

The electrostatically attracting sintered member is normally a plate covering the surface of the electrode. In this invention, however, the sintered member is divided into smaller pieces 101a,b, which are placed at predetermined locations on the surface of the electrode block 100. The electrode block 100 and the sintered members 101a,b are, as shown in FIG. 12, bonded together with an adhesive 102a,b. Bonding may be accomplished using a high-temperature epoxy adhesive or by low-temperature brazing. In this way, the sintered members 101a,b are secured on the upper surface of the electrode block 100. Then, as shown in FIG. 12, a film 103 is sprayed over the electrode block 100 and the sintered members 101a,b. The sprayed film may, for example, be made of alumina. The sprayed film 103 portion does not need to perform electrostatic attraction and thus can use alumina that has an excellent insulation resistance. That is, when the sprayed film is formed as an electrostatic attraction member, it is necessary for the sprayed film to have a resistance of about $10^{10}$-$10^{11}$ ohm·cm, whereas when it is used simply as an insulating film, the resistance may be as high as $10^{14}$ ohm·cm or higher, which is the resistance of alumina. The sprayed film therefore has a high breakdown voltage.

Figure 13:
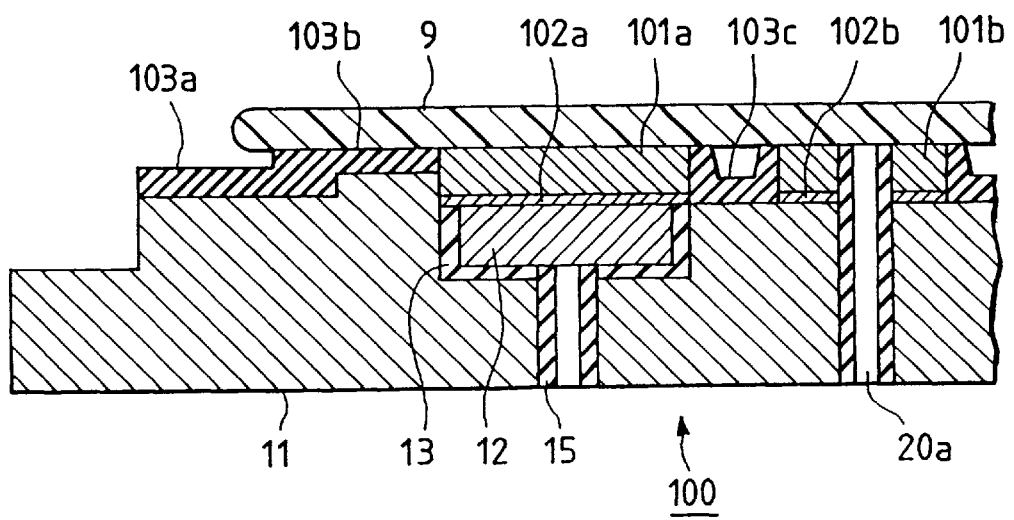
FIG. 13 is a vertical cross section showing the process of fabricating the electrostatically attracting electrode of FIG. 10, in a finished state that the electrostatically attracting electrode is completed after the sprayed film is polished.

Next, the electrode block 100 is polished down to the polished surface 104 shown in FIG. 12. As a result, the sintered members 101a,b are exposed to the surface as shown in FIG. 13. The electrostatically attracting electrode after being polished is shown in FIG. 13. The sintered members 101a,b exposed to the surface come in contact with the substrate and attract it electrostatically. At this time, a part of the sprayed film 103 also comes in contact with the substrate but, because of its high resistance, produces almost no attractive force. The electrostatic attraction force is generated substantially by the exposed sintered members 101a,b.

This process of manufacture offers the following advantages.

(1) Because the sintered members 101a,b are small in size, they can be manufactured easily.
(2) If the temperature of the electrode changes, the thermal expansion difference between the electrode block 100 and the sintered members 101a,b is small, exhibiting an excellent temperature resistance characteristic as one of mechanical properties.
(3) This electrode is adaptable to a large-size substrate 9 by adjusting the dimensions or the number of the sintered members 101a,b as necessary.
(4) The electrostatic attraction member made of the sintered material is often required to be 0.1 mm or less in thickness in the final stage. The electrostatic attraction member therefore must be polished after being bonded to the electrode. Because the sintered member comprises small blocks, they can be formed to a small thickness, reducing the thickness margin required for polishing after bonding.

The parts of the electrode block 100 where the sintered members 101a,b are to be provided are slightly recessed and the sintered members 101a,b are bonded to the recessed portions. This arrangement allows both the sintered members 101a,b and the sprayed film 103 to be polished easily at the same time even when the thickness margin is small. This method can also be used as a manufacturing method when it is desired to change the thicknesses of the sintered members 101a,b from one portion of the electrode block 100 to another. This method also has the advantage of being able to position the sintered members 101a,b easily.

The electrostatically attracting electrode shown in FIG. 10 is designed to provide a temperature control of a substrate by supplying the heat transmission gas to the back of the substrate. When the heat transmission gas is used, gas leakage from the periphery of the substrate must be prevented, requiring the electrode surface to tee formed flat. When the electrode is polished down to the polished surface 104 shown in FIG. 12, the surface of the sintered members 101a,b appears in the same plane as the sprayed film 103 as shown in FIG. 13. The seal of the heat transmission gas at the peripheral portion of the substrate 9 is achieved by the sprayed film 103b and the flat portion of the sintered members 101a connected to the sprayed film 103b. The sprayed film 103c is the portion of the film that is sprayed to a surface recessed one step lower and is not polished. The heat transmission gas such as helium supplied from the gas supply hole provided at the center of the electrode quickly passes through the sprayed film 103c and reaches the back of the substrate. The sprayed film 103c portion does not need to be machined, and by only arranging appropriately the sintered members 101a,b the substrate temperature distribution is made uniform. As a result, the heat transmission gas distribution grooves covered with the sprayed film 103c are made.

Figure 14:
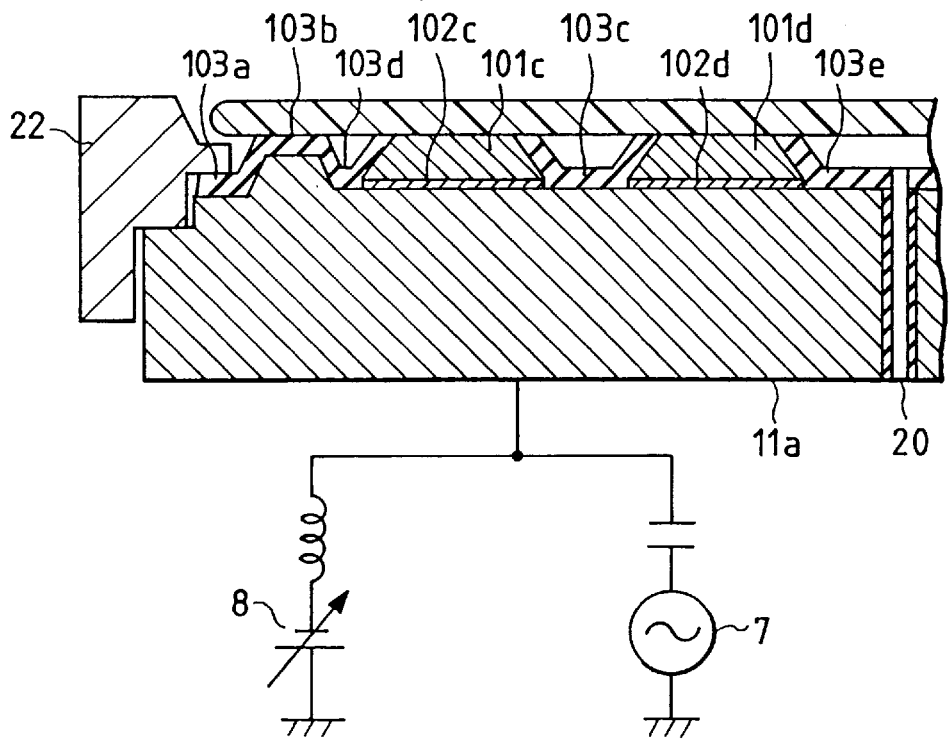
FIG. 14 is a vertical cross section showing a further embodiment of the electrostatically attracting electrode of FIG. 1.
Figure 15:
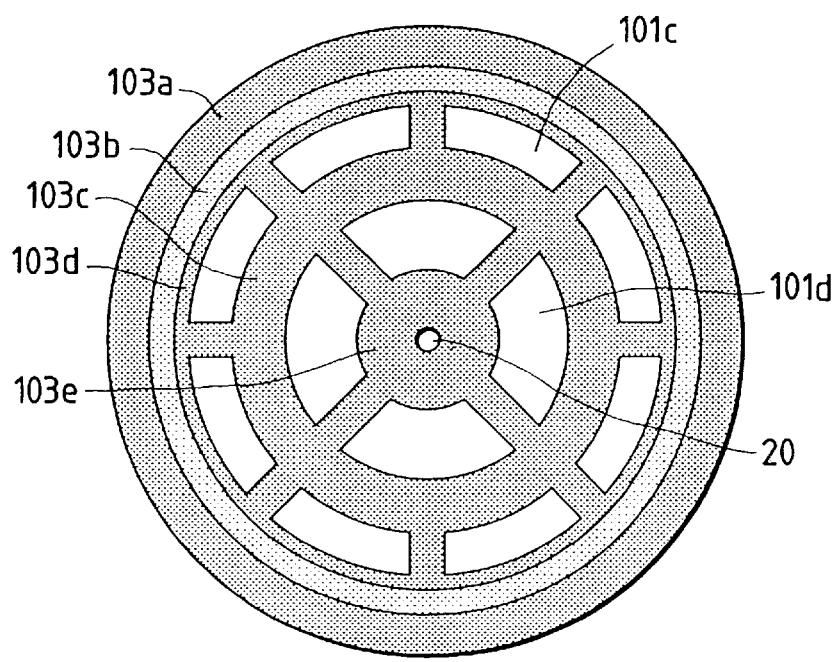
FIG. 15 is a plan view of the electrostatically attracting electrode of FIG. 14.

The cross-sections of the sintered members 101a,b of FIG. 12 are squares and forming sprayed films on such vertical surfaces are difficult. The cross-sections of the sintered members 101a,b are therefore trapezoids and the inclined slopes are at about 45 degrees. This arrangement allows the sprayed films to be formed more reliably. FIG. 14 shows the electrostatically attracting electrode with the sides of the sintered members 101c,d inclined.

The electrode block in this case is formed of a single electrode 11a and is connected with an electrostatic attraction power supply 8. In this case, a via hole 20 for supplying the heat transmission gas is made at the center of the electrode 11a. The electrode 11a has a raised ring portion along the periphery of the substrate 9, whose sidewalls are inclined. On the upper surface of the electrode 11a inside the raised ring portion, sintered members 101c,d are arranged on double circles and secured to the electrode block by an adhesive 102c,d. The upper surfaces of the electrode 11a and the sintered members 101c,d are sprayed with an insulating film. The electrode block including the sprayed film is polished at the top surface until the sintered members 101c,d have the predetermined thickness. As a result of this polishing, the sprayed film 103b formed over the raised ring portion is flush with the upper surfaces of the sintered members 101c. The sprayed film 103a, 103e, 103c, 103d portions are lower than the surface on which the substrate 9 is mounted, thus forming grooves. Likewise, grooves made by the sprayed films are also provided between the individual sintered members 101c,d that are arranged in circle. As a result, the via hole 20 leads to the grooves formed by the sprayed film to the sprayed film 103b. On the back of the substrate 9 the heat transmission gas is dispersed uniformly through the grooves of the sprayed film.

In the electrostatically attracting electrode of FIG. 13, seal of the heat transmission gas at the periphery of the substrate is provided by the flat portions of the sprayed film 103b and sintered members 101a. In the electrostatically attracting electrode of FIG. 14, on the other hand, the sealing of the gas is achieved only by the flat portion of the sprayed film 103b along the periphery of the substrate. With this arrangement, it is possible to realize a desired width of the raised ring portion of the electrode 11a and thus freely determine the dimensions of the heat transmission gas seal portion.

While, in the example of FIG. 14, the electrode block is a monopole type, a dipole type (for example, which an electrode 12 is provided under a sintered member 101 like FIG. 12) may also be used.

In this embodiment, because the electrostatic attraction film can be formed of small sintered members, it is possible to solve the substrate manufacture problem encountered when the wafer diameter increases, thus reducing the cost. Further, because the individual sintered members are small, their dimensions can easily be controlled and they can be fabricated to a reduced thickness. This makes the handling of the sintered members significantly simpler than a one-piece sintered member which is almost equal in diameter to the wafer. This also contributes to the reduction in the manufacturing cost.

Further, because this embodiment basically does not impose limitation on the wafer size, it can easily be applied to substrates of different shapes. For example, even a rectangular substrate causes no problem in manufacturing the electrostatically attracting electrode.

Another feature of this invention is the ability to prevent the electrostatic attraction member from being cracked or separated by the thermal expansion difference due to the material difference between the electrostatic attraction portion and the electrode block when the electrostatically attracting electrode is used at low or high temperatures. This improves the reliability of the electrode. That is, as the sintered member is small, the deformation of thermal expansion is small and it can avoid being cracked or separated.

A further advantage of this invention is that because this invention covers the sintered members, which are normally bonded to an electrode made of aluminum alloy by adhesives or brazing filler metal with a sprayed insulating film, the adhesives or solders can be prevented from leaking out during the wafer processing and from contaminating the wafer.

Furthermore, because the electrostatic attraction uses a dielectric mace of a sintered member, the electrostatic attraction performance is determined by the physical property of the sintered member. Therefore, the sprayed film of alumina need only be used for electrical insulation purpose and can have a higher breakdown voltage than an alumina-titania mixture that is used as an electrostatic attraction material. Hence, the electric insulation characteristic of the electrode can be improved.

Other embodiments are described using from FIG. 16 to FIG. 21 as follows.

Figure 16:
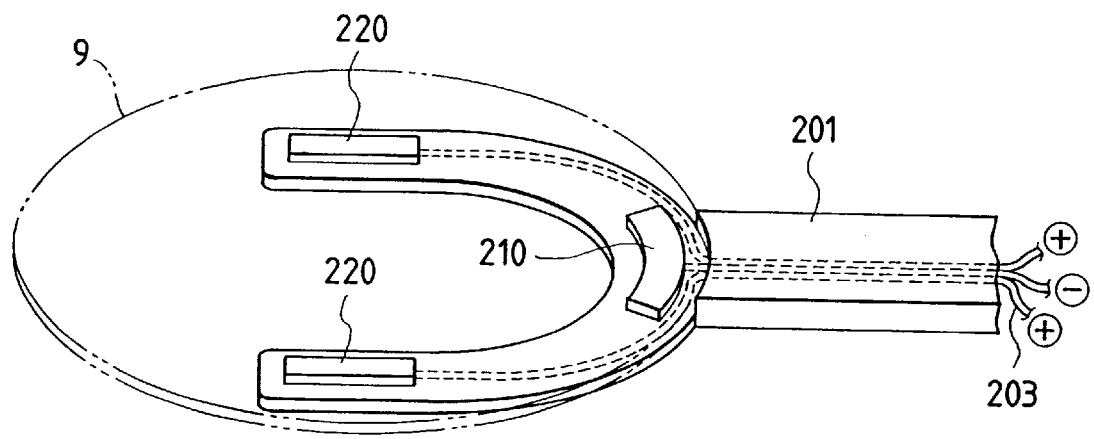
FIG. 16 is a perspective view showing a substrate supporting member of a substrate transfer apparatus when a further embodiment of the electrostatically attracting electrode is used as a part of the substrate supporting member.
Figure 17:
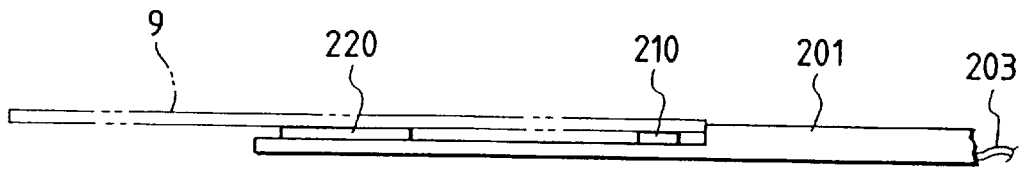
FIG. 17 is side view showing a substrate supporting member of FIG. 16.
Figure 18:
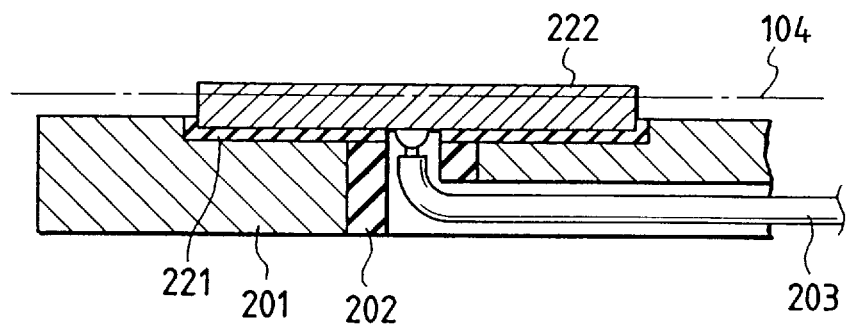
FIG. 18 is a cross section view showing a step of arranging an electrode in the manufacturing step of a substrate supporting member.
Figure 19:
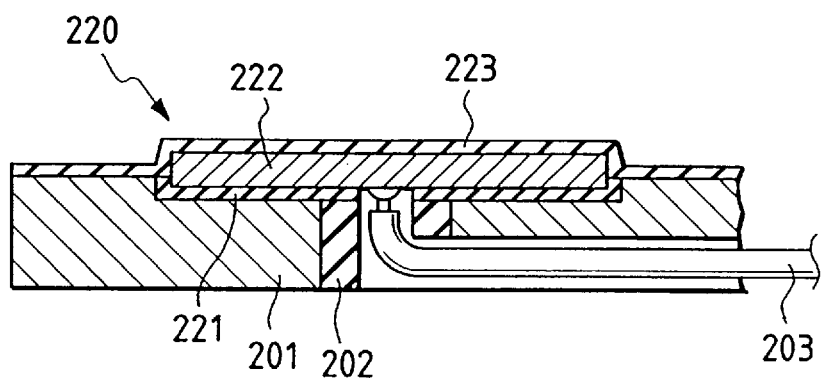
FIG. 19 is a cross section view showing a finished substrate supporting member in the manufacturing steps of a substrate supporting member.

FIG. 16 shows an embodiment in which our electrostatically attracting electrode is applied to a transfer arm which transfer substrata. As shown in FIG. 16 and FIG. 17, a supporting portion which supports a substrates is provided on an etch of a transfer arm 201. Supporting blocks 210,220 which support a backside of the substrate 9 by three points are provided in the supporting portion. A detailed cross sectional view of the supporting block 220 is shown in FIG. 19. The supporting block 210 is the same structure as the supporting block 220. A concave portion is provided on the upper surface of the transfer arm 201, that is, on the area where the supporting block 220 should be set in this case. An electrode 222 is provided on the concave portion via an insulating layer 221. FIG. 18 shows a supporting block 220 after the electrode 222 is arranged on the concave portion. These three supporting blocks 210,220 are set on the upper surface of the transfer arm 201. As shown in FIG. 18, the surface of electrode 222 is polished until polishing level can reach the level 104 of FIG. 18, and polish upper surface of three electrodes to reach the same level. After finishing to polish the electrode 222, insulating layer 223 is formed on the upper surface of the electrode 222 in FIG. 19. A through hole is formed under an electrode 222 of the transfer arm 201, a insulating-hole. A lead wire 203 is connected to the electrode 222 through a hole of the insulating tube 202. Lead wires 203 connected to three respective electrodes 222 are connected to a power of electrostatic attracting chuck which is not shown in FIG. 19.

A wafer can be hold securely by above structure even if the wafers radius is over 300 mm. Even if an operation speed of the transfer arm is increased, the substrate can be hold on the arm without slipping out of a correct position or falling from the arm, and can be transferred securely by using the arm of above mentioned embodiment. The transfer arm is useful for increasing a throughput of a semiconductor manufacturing equipment since the speed of transferring a substrate can be increased.

Figure 20:
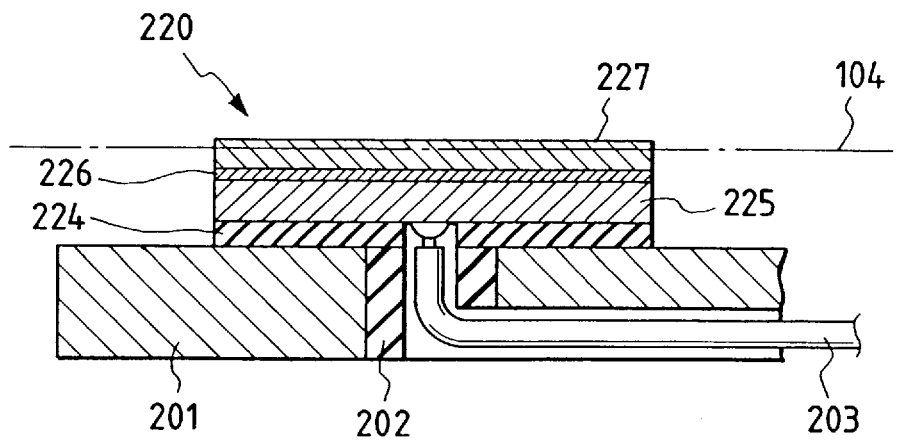
FIG. 20 is a cross section view showing a further embodiment of a substrate supporting member in FIG. 19.

FIG. 20 shows an other embodiment about the supporting block 220, in this case a sintered member is used on an electrode 225. An electrode 225 is provided on an upper surface of a transfer arm 201 via a insulating member 224. The sintered member 227 is attached to the upper surface of the electrode 225 using a bond 226. Plural sintered member 227 are provided on the transfer arm 201, and are polished to form the sintered member so that the upper surface height of sintered member can be the same level as one another. The present embodiment has the same effect as the above embodiments, and also has an effect of making easily the electrostatically attracting electrode because this embodiment can avoid a process of forming an insulating layer after polishing formation step.

Figure 21:
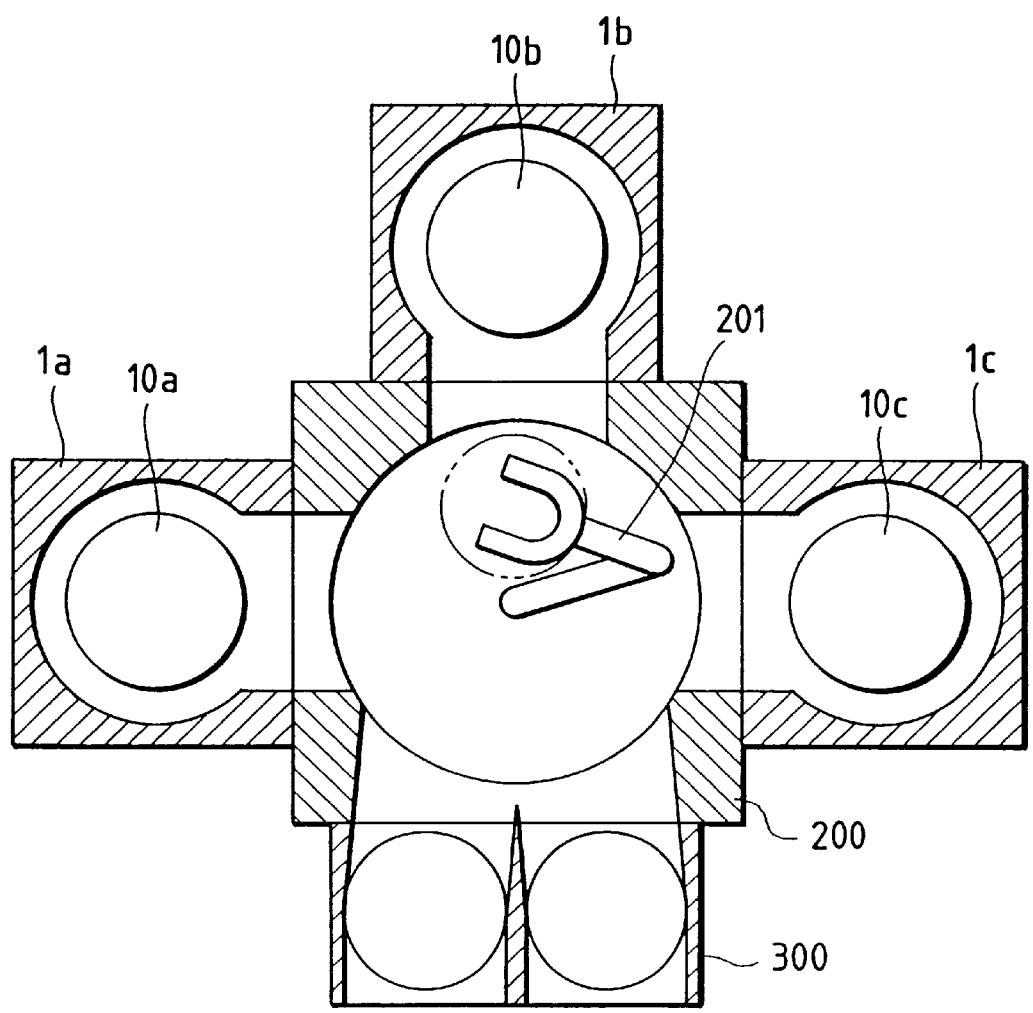
FIG. 21 is a horizontal sectional view showing a plasma processing apparatus in which an electrostatically attracting electrode and a substrate transfer apparatus is used.

The transfer arm manufactured by above mentioned way is arranged in a vacuum transfer room 200 as show in FIG. 21 as an example. Vacuum chamber 1a, 1b, 1c, load, unload lock room 300 are provided around the vacuum transfer room 300 like radial directions. The above mentioned electrostatically attracting electrodes 10a, 10b, 10c are provided within the vacuum chamber 1a, 1b, 1c. This substrate supplied form an area under an atmospheric pressure is carried into a vacuum condition area through the load lock room. The substrate is carried to the desired vacuum chamber by a transfer arm 201. The substrate which was processed in the vacuum chamber is transferred to the unload-lock room, and the substrate is open to the area under an atmospheric pressure through the unload-lock room. The substrate is electrostatically attracted to the transfer arm securely and is processed under a vacuum condition. Therefore the vacuum processing apparatus using this invention can increase a through-put and reliability.

As described above, this invention allows the electrostatically attracting electrode to be manufactured easily in sizes corresponding to large-diameter wafers to be processed.

What is claimed is:

1. An electrostatic chuck for holding a substrate, comprising:

an electrode block which serves as an electrode for electrostatic attraction;

a plurality of electrostatic attraction members arranged on an upper surface of said electrode block, said electrostatic attraction members being disposed so as to attract the substrate electrostatically and to come in contact with the substrate;

an insulating material substantially covering the upper surface of the electrode block other than portions of the upper surface of the electrode block where said electrostatic attraction members are arranged and covering sidewalls of the electrostatic attraction members; and grooves made by said insulating material being provided between the sidewalls of said individual electrostatic attraction members.

2. An electrostatic chuck according to claim 1, wherein the sidewalls of said electrostatic attraction members are inclined.

3. An electrostatic chuck for holding a substrate, comprising:

a first electrode having a recess therein;

an insulating layer formed over part of an electrode surface of said first electrode which is in said recess;

a second electrode provided in said recess of said first electrode;

a plurality of electrostatic attraction members arranged on an upper surface of at least one of said first and second electrodes, said electrostatic attraction members being disposed so as to attract the substrate electrostatically and to come in contact with the substrate;

an insulating material substantially covering the upper surface of at least one of said first and second electrodes other than portions of the upper surface of the at least one of said first and second electrodes where said electrostatic attraction members are arranged and covering at least portions of sidewalls of said electrostatic attraction member; and grooves made by said insulating material being provided between the sidewalls of said individual electrostatic attraction members.

* * * * *